United States Patent [19]
Liaw et al.

[11] Patent Number: 5,763,303
[45] Date of Patent: Jun. 9, 1998

[54] RAPID THERMAL CHEMICAL VAPOR DEPOSITION PROCEDURE FOR A SELF ALIGNED, POLYCIDE CONTACT STRUCTURE

[75] Inventors: Jhon Jhy Liaw, Taipei; Kuo Hsien Cheng, Taichung, both of Taiwan

[73] Assignee: Taiwan Semiconductor Manufacturing Company, Ltd., Hsin-Chu, Taiwan

[21] Appl. No.: 810,394

[22] Filed: Mar. 9, 1997

[51] Int. Cl.$^6$ ............................ H01L 21/8238
[52] U.S. Cl. .................. 438/210; 438/238; 438/381; 438/382; 438/385; 438/660
[58] Field of Search .................. 438/238, 210, 438/381, 385, 660, 768, 382

[56] References Cited

U.S. PATENT DOCUMENTS

| | | | |
|---|---|---|---|
| 4,796,562 | 1/1989 | Brors et al. | 118/725 |
| 5,461,006 | 10/1995 | Mehra | 437/200 |
| 5,510,296 | 4/1996 | Yen et al. | 437/200 |
| 5,652,181 | 7/1997 | Thakur | 438/385 |

*Primary Examiner*—Charles L. Bowers, Jr.
*Assistant Examiner*—Lynne A. Gurley
*Attorney, Agent, or Firm*—George O. Saile; Stephen B. Ackerman

[57] ABSTRACT

A process for fabricating MOSFET devices, for a SRAM cell, using a polycide contact structure, self-aligned to an underlying source and drain region, has been developed. This process features the use of a RTCVD procedure, featuring loading of wafers, as well as evacuation procedures, both performed at room temperature, in a first RTCVD chamber, followed by the deposition of polysilicon and tungsten silicide layers, performed in the same RTCVD chamber. The in situ, room temperature load and evacuation processes, followed by polysilicon and tungsten depositions, results in polycide interfaces with minimal levels of native oxide, thus improving device characteristics, and SRAM performance.

24 Claims, 4 Drawing Sheets

RAPID THERMAL CHEMICAL VAPOR DEPOSITION PROCEDURE FOR A SELF ALIGNED, POLYCIDE CONTACT STRUCTURE

RELATED PATENT APPLICATIONS

"A METHOD FOR REDUCING THE RESISTANCE OF SELF-ALIGNED CONTACTS, FOR TRIPLE POLYSILICON SRAM DEVICES" by J. J. Liaw, A. Wang, of Taiwan Semiconductor Manufacturing Corp., Ser. No. 08/783,981 (TSMC96-176) filed on Jan. 15, 1997. Assigned to a common assignee.

BACKGROUND OF THE INVENTION

(1) Field of the Invention

The present invention relates to a process used to fabricate metal oxide semiconductor field effect transistors, (MOSFET), devices, and more specifically to a process used to reduce the resistance of a self-aligned contact, (SAC), structure, used for the fabrication of MOSFET devices used for static random access memory, (SRAM), cells.

(2) Description of Prior Art

Static random access memory, (SRAM), cells, are now being fabricating using high speed, high density, complimentary metal oxide semiconductor, (CMOS), devices. Conventional SRAM cells are usually configured using either four n-channel, and two p-channel, MOSFET devices, or using four n-channel, and two resistor load devices. The four n-channel, and two resistor load type, SRAM configuration consumes less area then counterparts using both n-channel and p-channel devices, and thus has been used extensively. A triple polysilicon process has been used to fabricate devices used for the SRAM cell, comprised of n-channel and resistor load devices. In this process one polysilicon layer is used for the gate structure of the CMOS device, while a second polysilicon layer is used for the load resistors. A third polysilicon layer is used as part of a polycide, (metal silicide—polysilicon), composite structure, providing contact to source and drain regions of an underlying n-channel device. To further decrease the area needed to create this type of SRAM cell device, (n-channel and resistor loads), a self aligned contact, (SAC), concept has been developed. The SAC procedure consists of a SAC opening, in a dielectric layer, used to expose an underlying source and drain area. However the underlying source and drain area resides in a narrow space between two gate structures, and therefore the SAC opening for a subsequent SAC structure, can be enlarged to open an area not only over the entire source and drain regions, but also over adjacent portions of the gate structures. This procedure eliminates the difficult, conventional photolithographic procedure, used to open a contact hole in an insulator layer, with the contact hole having to fully land on the entire, underlying source and drain region. With that conventional procedure, in order to insure fully landed alignment to the underlying source and drain region, additional area has to be made available, thus increasing the SRAM cell size, and reducing SRAM density.

The ability to efficiently use the SAC structure is dependent on the ability to minimize the resistance at the interface between the overlying polycide structure and the top surface of the underlying source and drain region, exposed in the SAC opening. The polycide structure used with the triple polysilicon layer, SRAM process, is comprised of an underlying polysilicon layer, and an overlying tungsten silicide layer. Prior to the deposition of the underlying polysilicon layer, a thin, native oxide can reside on the top surface of the source and drain region, exposed in the SAC opening. If the native oxide is not removed, or reduced in thickness, the interface resistance, as well as other SRAM parameters can be adversely influenced. For example if the SAC resistance is high, parameters such as drain current, (Idsat), will be adversely effected. The major source of unwanted native oxide, at the polycide—substrate interface, occurs during the initial stages of an LPCVD procedure, used for deposition of a polysilicon layer, used for the underlying layer of a polycide structure. With conventional SRAM fabrication procedures, semiconductor substrates, or wafers, are inserted into a low pressure chemical vapor deposition, (LPCVD) apparatus, however these wafers experience a temperature in the range between about 380° to 620° C., prior to experiencing the evacuation procedure, used to reach deposition pressures, and more importantly used to remove unwanted oxygen and moisture from the ambient. However during the time needed for the evacuation procedure, residual oxygen and/or moisture can lead to the growth of unwanted native oxides, in the range between of 10 to 50 Angstroms, on the surface of the wafers, prior to polysilicon deposition.

Several attempts at dissolving native oxides, at polysilicon—silicon substrate interfaces have been disclosed. Liaw, et al, (invention to be filed, Ser. No. 08/783,981, TSMC96-176), teach a process for reducing the SAC interface resistance, after the polycide structure has been formed in the SAC opening, via a high temperature, rapid thermal anneal, (RTA), procedure. This is accomplished by disintegrating or dissolving the native oxide, which resided at the polycide—source and drain interface. Prior art such as Mehra, in U.S. Pat. No. 5,461,006, and Yen, et al, in U.S. Pat. No. 5,510,296, show methods of reducing the contact resistance of polycide structures to underlying silicon surfaces, via post native oxide procedures. However these inventions address the problem of removing native oxide after formation, while this present invention will teach, a more cost effective, and less complex process, of eliminating, or reducing, the level of formation of native oxide at the interface. This is accomplished by using a rapid thermal chemical vapor deposition, (RTCVD), procedure, in which wafers are loaded into a RTCVD tool, at room temperature, followed by the pump down procedure, again performed at room temperature, therefore not allowing the exposed source and drain regions of the SRAM device to experience oxygen or moisture at elevated temperatures, thus eliminating, or reducing the growth of unwanted native oxide.

SUMMARY OF THE INVENTION

It is an object of this invention to fabricate MOSFET devices for an SRAM cell, using a self aligned contact, (SAC), process, allowing polysilicon to contact an underlying source and drain region.

It is another object of this invention to minimize the resistance of a contact structure in the SAC opening, at the interface between an overlying polysilicon layer and an underlying source and drain region.

It is yet another object of this invention to use a rapid thermal chemical vapor deposition (RTCVD), process, featuring wafer insertion and evacuation procedures, performed at room temperature, followed by polysilicon deposition, in the same RTCVD apparatus, to reduce or eliminate native oxide formation at the SAC polycide—substrate interface.

In accordance with the present invention a process is described for fabricating MOSFET devices used for SRAM cells, using a SAC process for polycide contact to underlying silicon regions, in which the interface resistance in the SAC opening, between an overlying SAC structure, and an underlying silicon region, has been minimized via the use of an RTCVD polysilicon procedure. After formation of polycide gate structures, on thin gate oxides, and with the polycide gate structure capped with an insulator layer, lightly doped source and drain regions are formed, in areas not covered by the insulator capped, polycide gate structures. After formation of insulator spacers, on the sides of the polycide gate structures, heavily doped source and drain regions are formed in the space between polycide gate structures. An insulator layer is deposited and patterned to produce a self-aligned contact, (SAC), opening, exposing a heavily doped source and drain region in the space between insulator capped, polycide gate structures. A deposition of an underlying polysilicon layer, using a RTCVD apparatus and procedure, is next performed, resulting in a low level of native oxide residing at the polysilicon—source and drain interface. An overlying metal silicide layer is then also deposited using the RTCVD apparatus and procedures, resulting in a low level of native oxide residing at the metal silicide polysilicon interface. Patterning of the metal silicide and polysilicon layers is used to create a polycide SAC structure, in the SAC opening, partially overlying the insulator capped, polycide gate structures. Deposition of another insulator layer, is followed by deposition and patterning of another polysilicon layer, creating polysilicon load resistors. A composite interlevel dielectric layer is next deposited, followed by a low temperature anneal, used to reflow the composite interlevel dielectric layer. Subsequent processing includes opening contact holes exposing the polycide SAC structure, and exposing the polysilicon load resistors, followed by creation of a metal plug, filling the contact hole openings, and contacting the underlying polycide SAC structure and polysilicon load resistors. Creation of a metal interconnect, is then performed, providing contact to the metal plug.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating MOSFET devices, used for an SRAM cell, using a SAC process which features interface resistance reductions as a result of a rapid thermal chemical vapor deposition procedure, will now be described in detail. The SRAM cell, to which this invention will be applied to, will be an SRAM cell comprised of n-channel, MOSFET devices, and load resistors. This invention can also be applied to SRAM cells comprised of n-channel, MOSFET devices, and p-channel, MOSFET devices. This process will then use polysilicon load resistors, in place of the p-channel, MOSFET devices.

Figure 1:
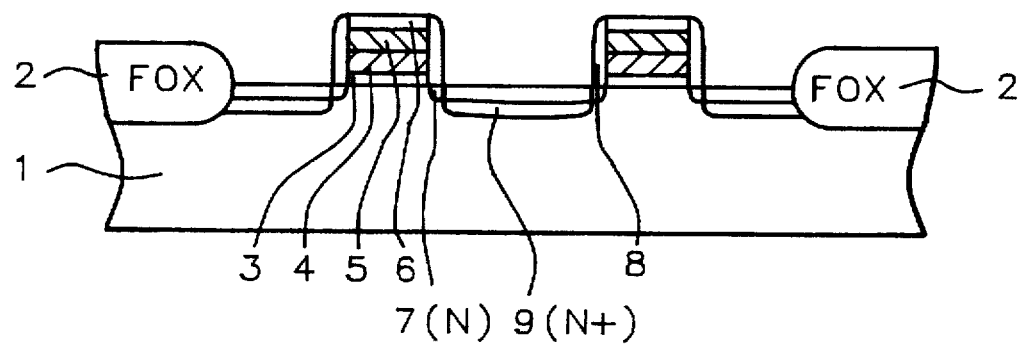
FIGS. 1–7, which schematically, in cross-sectional style, present key stages of fabrication of the MOSFET devices, used for creation of an SRAM cell, incorporating the SAC process, and the rapid thermal chemical vapor deposition procedure, used to reduce the interface resistance between a polysilicon layer, of a polycide SAC structure, and an underlying source and drain region, as well as reducing the interface resistance between a metal silicide layer and an underlying polysilicon layer.

A P type, single crystalline, silicon substrate, 1, with a <100> crystallographic orientation, is used, and shown schematically in FIG. 1. Field oxide, (FOX), regions, 2, formed for isolation purposes, are thermally grown to a thickness between about 3000 to 5000 Angstroms, using thermal oxidation procedures. Subsequent device regions are protected from the FOX oxidation procedure by oxidation resistant masking patterns, comprised of a silicon nitride—silicon oxide composite masking layer. After removal of the composite, oxidation resistant mask, a thin gate, silicon dioxide layer, 3, is thermally grown, in an oxygen steam ambient, at a temperature between about 850° to 1000° C., to a thickness between about 50 to 250 Angstroms. Next a first layer of in situ doped polysilicon, 4, is deposited using low pressure chemical vapor deposition, (LPCVD), procedures, at a temperature between about 500° to 700° C., to a thickness between about 500 to 2000 Angstroms, using silane as a source, and with the addition of phosphine to provide the needed dopant. A first layer of tungsten silicide, 5, is then deposited, using LPCVD procedures, at a temperature between about 400° to 600° C., to a thickness between about 750 to 1500 Angstroms, using tungsten hexafluoride and silane as a source. Finally a first silicon oxide layer, 6, is deposited using either LPCVD or plasma enhanced chemical vapor deposition, (PECVD), procedures, at a temperature between about 300° to 700° C., to a thickness between about 1000 to 3000 Angstroms, using tetraethylorthosilicate, (TEOS), as a source.

Conventional photolithographic and reactive ion etching, (RIE), procedures, using $CHF_3$ as an etchant for first silicon oxide layer, 6, and $Cl_2$ as an etchant for both first tungsten silicide layer, 5, and first polysilicon layer, 4, are used to produce the silicon oxide capped, polycide gate, (first tungsten silicide—first polysilicon), structures, shown schematically in FIG. 1. After photoresist removal via plasma oxygen ashing and careful wet cleans, a lightly doped source and drain region, 7, is next created via ion implantation of phosphorous or arsenic, at an energy between about 25 to 75 KeV, at a dose between about 5E11 to 5E13 atoms/cm². A second silicon oxide layer is deposited, again via use of either LPCVD or PECVD procedures, at a temperature between about 300° to 700° C., to a thickness between about 1500 to 4000 Angstroms, using TEOS as a source, followed, by an anisotropic RIE procedure, using $CHF_3$ as an etchant, to create insulator spacers, 8, schematically shown in FIG. 1. The space between polycide gate spacers, to be used as part of the surface area for contact the subsequent SAC structure is between about 0.3 by 0.5 uM. Heavily doped source and drain regions, 9, are then produced via ion implantation of either arsenic or phosphorous, at an energy between about 30 to 100 KeV, at a dose between about 1E14 to 1E16 atoms/cm². This region is also shown schematically in FIG. 1.

Figure 2:
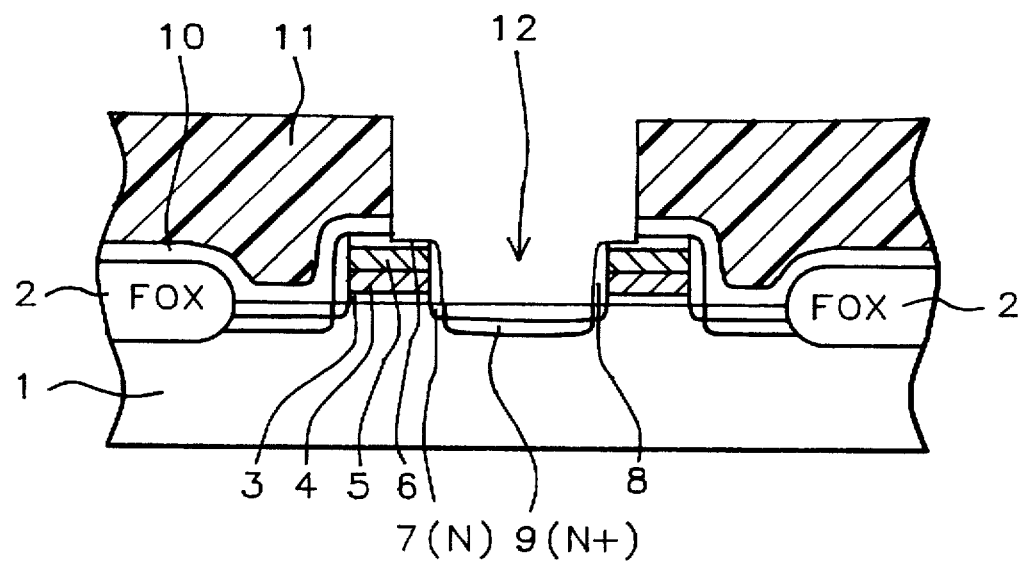

A third layer of silicon oxide, 10, is deposited, again using either LPCVD or PECVD procedures, at a temperature between about 300° to 700° C., to a thickness between about 1000 to 2000 Angstroms, using TEOS as a source. A first photoresist shape, 11, is formed, allowing a self-aligned contact, (SAC), opening, 12, with the opening having a dimension of about 0.4 by 0.6 uM, to be created by RIE of third silicon oxide layer, 10, using $CHF_3$ as an etchant. SAC opening, 12, schematically shown in FIG. 2, exposes a heavily source and drain region, 9, in the space between polycide gate structures. The design of SAC opening, 12, also results in the removal of third silicon oxide layer, 10, and of a portion of the capping, first silicon oxide layer, 6, from the top surface of the polycide gate structures, in a region where the polycide gate structures border the space between polycide gate structures.

Figure 3:
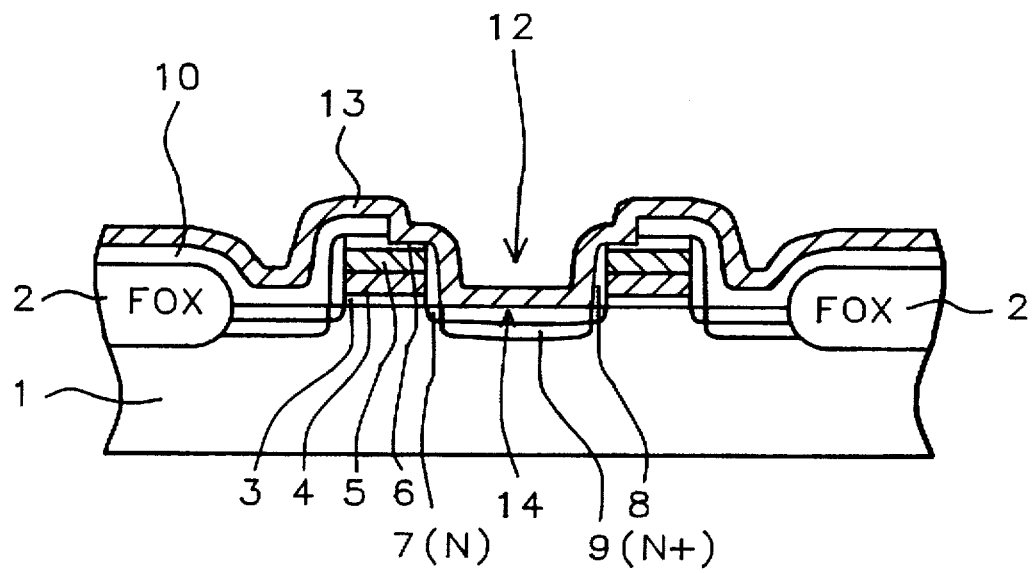

After removal of first photoresist shape, 11, via plasma oxygen ashing and careful wet cleans, a second layer of polysilicon, 13, schematically shown in FIG. 3, is deposited using rapid thermal chemical vapor deposition, (RTCVD), procedures, using a dual chamber RTCVD tool. This procedure features a first stage of the RTCVD procedure, comprised of loading the wafers in a first RTCVD chamber, at room temperature. A pump-down, or evacuation cycle, is next performed in the first RTCVD chamber, again at room temperature, with the pump-down procedure resulting in a pressure between about 100 to 150 Torr. Therefore unwanted ambients, such as oxygen and moisture, are removed from the first RTCVD chamber while the wafers, with exposed surfaces of heavily doped source and drain regions, 9, are still residing at room temperature, therefore resulting in the absence of, or a minimal amount, of native oxide formation. Conventional LPCVD processing, performs the evacuation procedures at temperatures between about 380° to 620° C., thus resulting in between about 10 to 50 Angstroms of native oxide formation, prior to polysilicon deposition. However in this invention the wafers have experienced the pump-down cycle at room temperature, with little or no native oxide formation.

A second stage of the RTCVD procedure now includes the temperature ramp—up, and polysilicon deposition steps, both performed in the same first RTCVD chamber that was used for the room temperature wafer loading. The wafer temperature is now ramped—up, to a temperature between about 625° to 675° C., in the same first RTCVD chamber used to previously load the wafers, therefore avoiding breaking vacuum, and not experiencing oxygen or moisture. The second stage of the RTCVD procedure now allows the wafers to experience the deposition of a second polysilicon layer, 13, at a temperature between about 625° to 675° C., to a thickness between about 500 to 600 Angstroms, using silane as a source. Also included in the deposition ambient is the addition of phosphine, used to in-situ dope polysilicon layer, 13. The amount of native oxide at interface, 14, between polysilicon layer, 13, and heavily doped source and drain region, 9, schematically shown in FIG. 3, is only between about 5 to 15 Angstroms, as a result of the RTCVD procedure.

Figure 4:
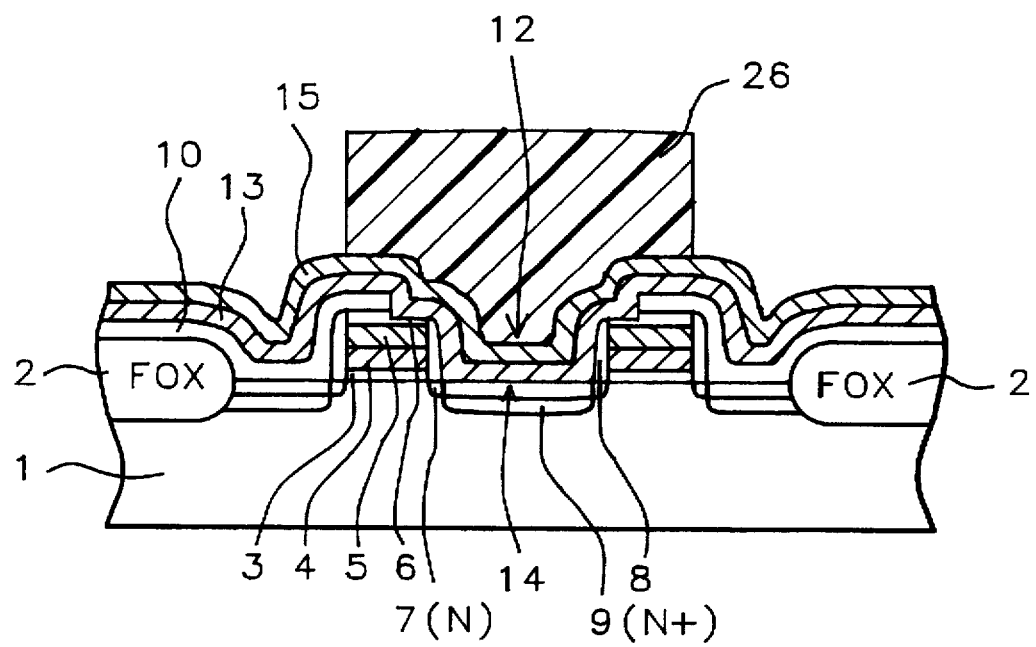

A third stage of the RTCVD procedure is used to deposit a second layer of tungsten silicide, 15, consisting of the wafers moving, in situ, without breaking vacuum, to a second chamber of the RTCVD tool. Second tungsten silicide layer, 15, schematically shown in FIG. 4, is deposited at a temperature between about 400° to 600° C., to a thickness between about 1000 to 1500 Angstroms, using tungsten hexafluoride and silane as a source. The ability to in situ deposit second tungsten silicide layer, 15, on underlying second polysilicon layer, 13, in the same RTCVD apparatus, without breaking vacuum, reduces the risk of native oxide formation on the top surface of second polysilicon layer, 13, which could create unwanted interface resistance between second tungsten silicide layer, 15, and second polysilicon layer, 13. A photoresist shape, 26, to be used as a mask to define a subsequent SAC structure, is also schematically shown in FIG. 4.

During the third stage of the RTCVD procedure, the first RTCVD chamber experiences a cool down cycle, followed by the room temperature loading of more wafers, to restart the first stage of the RTCVD procedure.

Figure 5:
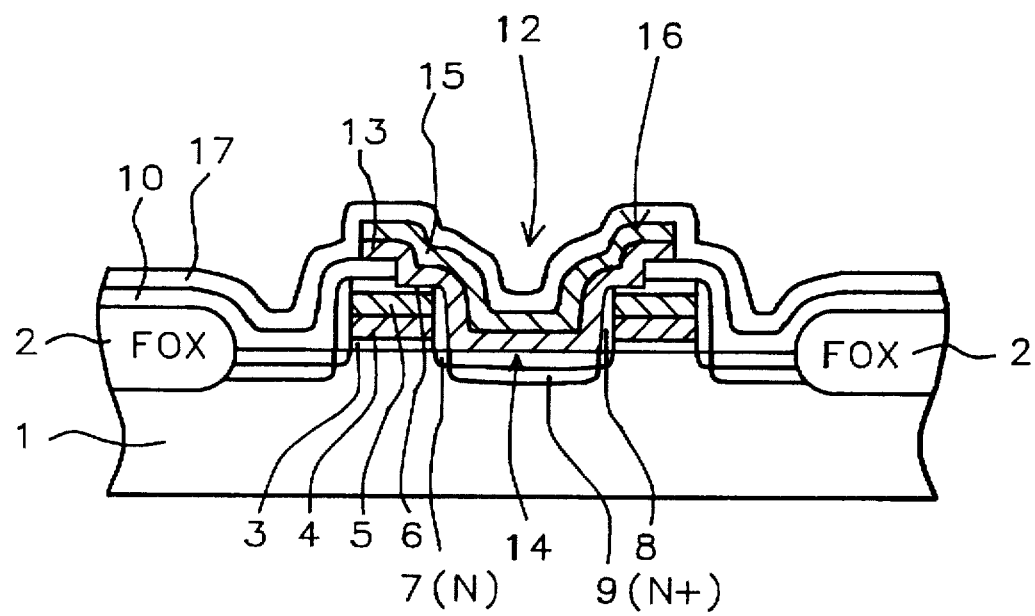

A RIE etching procedure, using $Cl_2$ as an etchant, is employed to create polycide SAC structure, 16, comprised of overlying second tungsten silicide layer, 15, and an underlying second polysilicon layer, 13. This is shown schematically in FIG. 5. The SAC structure, 16, is comprised of interface, 14, between second polysilicon layer, 13, and heavily doped source and drain region, 9, as well as the interface between second tungsten silicide layer, 15, and underlying second polysilicon layer, 13, featuring a minimum of native oxide, as a result of the RTCVD apparatus and procedures, allowing in situ removal of unwanted ambients, at room temperatures. Photoresist shape, 26, used as a mask for the patterning of polycide SAC structure, 16, is removed via plasma ashing and wet clean procedures. A fourth layer of silicon oxide, 17, is next deposited, using PECVD procedures, at a temperature between about 400° to 700° C., to a thickness between about 1000 to 2000 Angstroms, using TEOS as a source.

Figure 6:
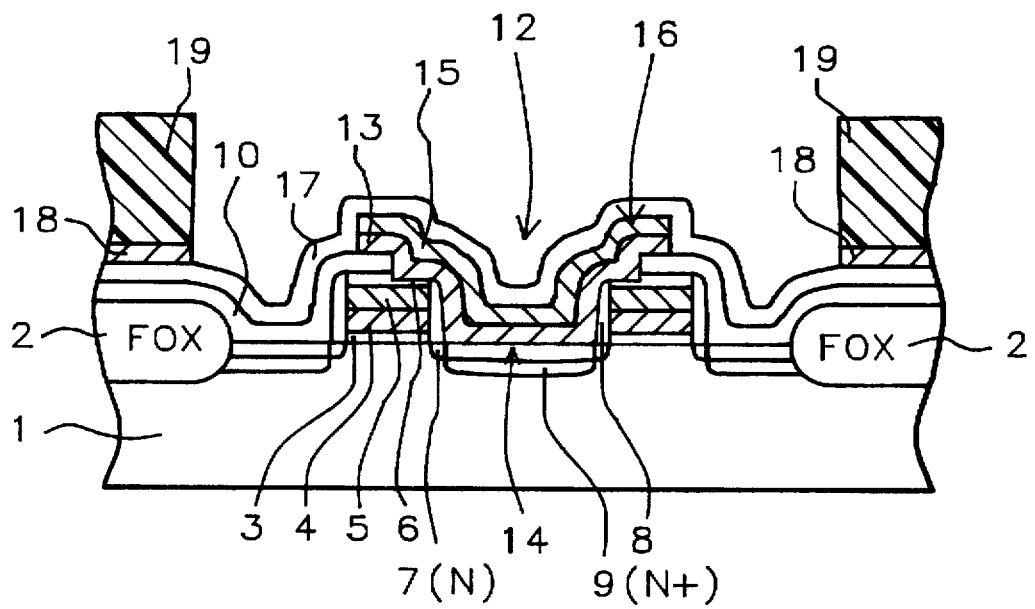

FIG. 6, schematically shows the formation of polysilicon load resistors, 18. A third layer of polysilicon, is first deposited using LPCVD procedures, at a temperature between about 500° to 700° C., to a thickness between about 450 to 650 Angstroms. Photoresist shapes, 19, are used for masking, allowing a RIE procedure, using $Cl_2$ as an etchant, to define polysilicon load resistors, 18. The desired resistance of polysilicon load resistors, 18, is determined by the length of the polysilicon load resistor, or the in situ doping level, used during the deposition of the third polysilicon layer.

After removal of photoresist shapes, 19, again using plasma oxygen ashing, and careful wet cleans, a composite interlevel dielectric layer, 20, is deposited. The composite interlevel dielectric layer, 20, is comprised of an underlying PECVD deposited, TEOS oxide layer, deposited at a temperature between about 300° to 700° C., to a thickness between about 1000 to 2000 Angstroms, and an overlying PECVD deposited, boron-phosphorous doped, TEOS, (BPTEOS), oxide layer, deposited at a temperature between about 500° to 700° C., to a thickness between about 3000 to 12000 Angstroms. A temperature cycle between about 750° to 900° C. is then used to allow the overlying BPTEOS to reflow, resulting in a smooth topology of the composite interlevel dielectric layer, shown schematically in FIG. 7. Conventional photolithographic and RIE procedures, using $CHF_3$ as an etchant, are used to open contact holes, 21, in composite interlevel dielectric layer, 20, to expose polysilicon load resistors, 18, while the same procedure allows the opening of contact hole, 21, in composite interlevel dielectric layer, 20, and in fourth silicon oxide layer, 17, exposing SAC contact structure, 16.

Figure 7:
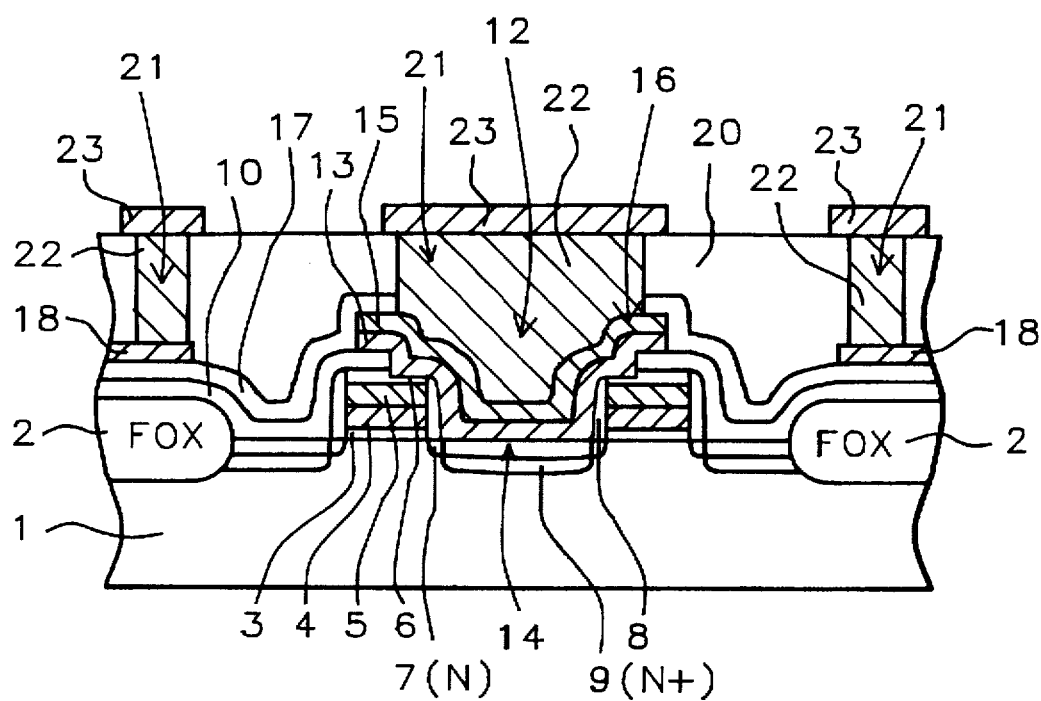

After photoresist removal, accomplished via plasma oxygen ashing and careful wet cleans, contact holes, 21, are then filled with tungsten plugs, 22, again schematically shown in FIG. 7. Tungsten plugs, 22, can be formed by selective deposition of tungsten, only on the exposed top surfaces of SAC structure, 16, and polysilicon load resistors, 18, via LPCVD procedures, at a temperature between about 400° to 500° C., to a thickness between about 4000 to 7000 Angstroms. Tungsten plug, 22, can also be formed by a blanket tungsten deposition, at a temperature between about 400° to 500° C., to a thickness between about 4000 to 7000 Angstroms, followed by removal of unwanted tungsten, from the top surface of composite interlevel dielectric layer, 20, via either RIE, using $Cl_2$ as an etchant, or via chemical mechanical polishing procedures. A metal deposition of aluminum, containing between about 1 to 3% copper, is performed, using r.f. sputtering procedures, to a thickness between about 3000 to 6000 Angstroms. Conventional photolithographic and RIE procedures, using $Cl_2$ as an etchant, are used to create interconnect metal structure, 23, schematically shown in FIG. 7. Photoresist removal is once again accomplished via plasma oxygen ashing, and careful wet cleans.

As a result of creating a SAC structure, 16, using the RTCVD procedure for deposition of second polysilicon layer, 13, interface, 14, between overlying second polysilicon layer, 13, and the underlying source and drain region, has formed with a minimum of native oxide. The SAC interface resistance, for an opening of 0.5 by 0.3 uM, has been reduced from about 2500 ohms, for SAC structures formed using conventional LPCVD procedures, to about 300 ohms, via use of the RTCVD process. The advantage of the lower interface resistance increases Idsat by about 25%, thus improving the performance of the SRAM device.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating MOSFET devices, for a SRAM cell, on a semiconductor substrate, using a rapid thermal chemical vapor deposition, (RTCVD), procedure, to deposit a polysilicon layer, and a metal silicide layer, needed for formation of a polycide, self-aligned contact, (SAC), structure, comprising the steps of:

forming field oxide regions in said semiconductor substrate;

growing a gate insulator layer on said semiconductor substrate, in areas not covered by said field oxide regions;

depositing a first polysilicon layer on said gate insulator layer;

depositing a first metal silicide layer on said first polysilicon layer;

depositing a first insulator layer on said first metal silicide layer;

patterning of said first insulator layer, of said first metal silicide layer, and of said first polysilicon layer, to form polycide gate structures, on said gate insulator layer;

ion implanting a first conductivity imparting dopant into said semiconductor substrate, in regions not covered by said polycide gate structures, to form a lightly doped source and drain region;

depositing a second insulator layer;

anisotropic etching of said second insulator layer to form insulator spacers on the sides of said polycide gate structures;

ion implanting a second conductivity imparting dopant into said semiconductor substrate, in regions not covered by said polycide gate structures, or not covered by said insulator spacers, to form a heavily doped source and drain region;

depositing a third insulator layer;

opening a hole in said third insulator layer, creating a self-aligned contact, (SAC), opening, exposing said heavily doped source and drain region, in said semiconductor substrate, in the space between said polycide gate structures, with said insulator spacers;

performing the first stage of said RTCVD procedure, comprised of loading wafers into a first RTCVD chamber, and reducing the pressure in said first RTCVD chamber, at room temperature;

performing the second stage of said RTCVD procedure, comprised of ramping up the temperature and depositing a second polysilicon layer, in a first RTCVD chamber;

performing the third stage of said RTCVD procedure, comprised of moving said wafers to a second RTCVD chamber, without breaking vacuum, and depositing a second metal silicide layer on said second polysilicon layer;

patterning of said second metal silicide layer, and of said second polysilicon layer, to create a polycide, self-aligned contact, (SAC), structure, completely overlying said SAC opening, and with said polycide SAC structure partially overlying a portion of said polysilicon gate structures, in regions where said polycide gate structures are adjacent to said SAC opening;

depositing a fourth insulator layer;

depositing a third polysilicon layer;

patterning of said third polysilicon layer to create polysilicon load resistors;

depositing a composite interlevel dielectric layer on said polysilicon load resistors, and on said fourth insulator layer in regions in which fourth insulator layer is not covered by said polysilicon load resistors;

opening contact holes in said composite interlevel dielectric layer to expose top surface of said polysilicon load resistors;

opening a contact hole in said composite interlevel dielectric layer, and in said fourth insulator layer, to expose top surface of said polycide SAC structure;

forming a metal plug in said contact holes, contacting underlying, said polysilicon load resistors, and contacting underlying, said polycide SAC structure; and forming an interconnect metallization structure, overlying, and contacting, underlying, said metal plugs.

2. The method of claim 1, wherein said first polysilicon layer, of said polycide gate structure, is deposited using LPCVD procedures, at a temperature between about 500° to 700° C., to a thickness between about 500 to 1500 Angstroms, using silane as a source, and with the addition of phosphine to provide, to provide in situ doping.

3. The method of claim 1, wherein said first metal silicide layer, of said polycide gate structure, is tungsten silicide, deposited using LPCVD procedures, at a temperature between about 400° to 600° C., to a thickness between about 750 to 1500 Angstroms, using silane and tungsten hexafluoride as a source.

4. The method of claim 1, wherein said polycide gate structures are formed via anisotropic, RIE, using $CHF_3$ as an etchant for said first insulator layer, and using $Cl_2$ as an etchant for said first metal silicide layer, and for said first polysilicon layer.

5. The method of claim 1, wherein said insulator spacers, formed on sides of said polycide gate structures, are comprised of silicon oxide, deposited using LPCVD or PECVD procedures, using TEOS as a source, to a thickness between about 1500 to 4000 Angstroms, and etched via anisotropic RIE procedures, using $CHF_3$ as an etchant.

6. The method of claim 1, wherein the space, in said semiconductor substrate, between said polycide gate structures, with said insulator spacers on sides of said polycide gate structures, is between about 0.3 by 0.5 uM.

7. The method of claim 1, wherein said second imparting conductivity dopant, used to form said heavily doped source and drain regions, in exposed region of said semiconductor substrate, between said polycide gate structures, is arsenic or phosphorous, ion implanted at an energy between about 30 to 100 KeV, at a dose between about 1E14 to 1E16 atoms/cm$^2$.

8. The method of claim 1, wherein said SAC opening, in said third insulator layer, exposing said heavily doped source and drain regions, between said polycide gate structures, is formed via anisotropic RIE procedures, using CHF$_3$ as an etchant, with said SAC opening having a dimension of about 0.4 by 0.6 uM.

9. The method of claim 1, wherein said first stage of said RTCVD procedure is used to load wafers, and to reduce the pressure in said first RTCVD chamber, by pumping down to create a pressure of between about 100 to 150 Torr, at room temperature.

10. The method of claim 1, wherein said second polysilicon layer is deposited in said first RTCVD chamber, at a temperature between about 625° to 675° C., to a thickness between about 500 to 600 Angstroms, using silane as a source, and using phosphine to provide the in situ doping.

11. The method of claim 1, wherein said second metal silicide layer is tungsten silicide, is deposited in said second RTCVD chamber, at a temperature between about 400° to 600° C., to a thickness between about 1000 to 1500 Angstroms, using tungsten hexafluoride and silane as a source.

12. The method of claim 1, wherein said polycide SAC structure is formed via anisotropic RIE procedures, using Cl$_2$ as an etchant for said second metal silicide layer, and for said second polysilicon layer.

13. A method for forming a tungsten silicide—polysilicon, polycide, self-aligned contact, (SAC), structure, for MOSFET devices, in an SRAM cell, on a semiconductor substrate, using a rapid thermal chemical vapor deposition, (RTCVD), procedure, for polysilicon and tungsten silicide depositions, in which said RTCVD procedure allows a reduction of native oxide formation at the polysilicon—source and drain interface, and at the tungsten silicide—polysilicon interface, comprising the steps of:

growing a gate insulator layer on said semiconductor substrate;

depositing an in situ doped, first polysilicon layer, on said gate insulator layer;

depositing a first tungsten silicide layer, on said first polysilicon layer;

depositing a first silicon oxide layer on said first tungsten silicide layer;

patterning of said first silicon oxide layer, of said first tungsten silicide layer, and of said first polysilicon layer, to from polycide gate structures on underlying, said gate insulator layer;

ion implanting a first conductivity imparting dopant into a region of said semiconductor substrate, not covered by said polycide gate structures, to form a lightly doped source and drain region;

depositing a second silicon oxide layer;

anisotropic etching of said second silicon oxide layer to form silicon oxide spacers on the sides of said polycide gate structures;

ion implanting a second conductivity imparting dopant into a region of said semiconductor substrate, not covered by said polycide gate structures, and not covered by said silicon oxide spacers, to form said heavily doped source and drain region in a region between said polycide gate structures;

depositing a third silicon oxide layer;

forming a self-aligned contact, (SAC), opening in said third silicon oxide layer, exposing said heavily doped source and drain region, in the region of said semiconductor substrate, between said polycide gate structures and said silicon oxide spacers;

performing the first stage of said RTCVD procedure, comprising loading wafers into a first RTCVD chamber, at room temperature, and reducing the pressure in said first RTCVD, at room temperature;

performing the second stage of said RTCVD procedure, comprised of ramping up the temperature and depositing an in situ doped, second polysilicon layer, in said first RTCVD chamber;

performing the third stage of said RTCVD procedure, comprised of moving said wafers to a second RTCVD chamber, without breaking vacuum, and depositing a second tungsten silicide layer on said second polysilicon layer;

patterning of said second tungsten silicide layer, and of said second polysilicon layer, to form said polycide SAC structure, completely overlying said heavily doped source and drain region, in said SAC opening, and partially overlying a portion of the top of said polycide gate structures, in areas where said polycide gate structures abut said SAC opening;

depositing a fourth silicon oxide layer;

depositing a third polysilicon layer;

patterning said third polysilicon layer to create polysilicon load resistors;

depositing a composite interlevel dielectric layer, on said polysilicon load resistors, and on the underlying, said fourth silicon oxide layer, in regions in which said fourth silicon oxide layer is not covered by said polysilicon load resistors;

opening contact holes in said composite interlevel dielectric layer, exposing a top surface of said polysilicon load resistors;

opening a contact hole in said composite interlevel dielectric layer, and in said fourth silicon oxide layer, to expose the top surface of said polycide SAC structure;

forming a tungsten plug in said contact holes, contacting the top surface of underlying, said polycide SAC structure, and contacting the top surface of underlying, said polysilicon load resistors; and forming an interconnect metallization structure, overlying and contacting, a top surface of said tungsten plugs.

14. The method of claim 13, wherein said first polysilicon layer, of said polycide gate structure, is deposited using LPCVD processing, at a temperature between about 500° to 700° C., to a thickness between about 500 to 1500 Angstroms, using silane as a source, and using phosphine to provide in situ doping.

15. The method of claim 13, wherein said first tungsten silicide layer, of said polycide gate structure, is deposited using LPCVD procedures, at a temperature between about 400° to 600° C., to a thickness between about 750 to 1500 Angstroms, using tungsten hexafluoride and silane as a source.

16. The method of claim 13, wherein said polycide gate structure is formed via anisotropic RIE procedures, using CHF$_3$ as an etchant for said first silicon oxide layer, and using Cl$_2$ as an etchant for said first tungsten silicide layer, and for said first polysilicon layer.

17. The method of claim 13, wherein said silicon oxide spacers, on the sides of said polycide gate structures, are formed by deposition of a second silicon oxide layer, using PECVD or LPCVD procedures, at a temperature between about 300° to 700° C., to a thickness between about 1500 to 4000 angstroms, using TEOS as a source, followed by an anisotropic RIE procedure, using $CHF_3$ as an etchant.

18. The method of claim 13, wherein the space between said polycide gate structures, including said silicon oxide spacers, is between about 0.3 to 0.5 uM.

19. The method of claim 13, wherein said second conductivity imparting dopant, used to create said heavily doped regions, in the space between said polycide gate structures, is arsenic or phosphorous, ion implanted at an energy between about 30 to 100 KeV, at a dose between about 1E14 to 1E16 atoms/cm$^2$.

20. The method of claim 13, wherein said SAC opening is created in said third silicon oxide layer, via anisotropic RIE procedures, using $CHF_3$ as an etchant, with said SAC opening having a dimension of about 0.4 by 0.6 uM.

21. The method of claim 13, wherein said first stage of said RTCVD procedure, is used to load wafers in said first RTCVD chamber, and to reduce pressure in said first RTCVD chamber, to between about 100 to 150 Torr, at room temperature.

22. The method of claim 13, wherein said second stage of said RTCVD procedure, is used to deposit said second polysilicon layer, used as part of said polycide SAC structure, in said first RTCVD chamber, at a temperature between about 625° to 675° C., to a thickness between about 500 to 600 Angstroms, using silane as a source, and phosphine to provide the in situ doping.

23. The method of claim 13, wherein said third stage of said RTCVD procedure, is used to deposit said second tungsten silicide layer, of said polycide SAC structure, in said second RTCVD chamber, at a temperature between about 400° to 600° C., to a thickness between about 1000 to 1500 Angstroms, using tungsten hexafluoride and silane as a source.

24. The method of claim 13, wherein said polycide SAC structure is formed via anisotropic RIE procedures, using $Cl_2$ as an etchant for said second tungsten silicide layer, and for said second polysilicon layer.

* * * * *